US010954607B1

(12) United States Patent
Antipov et al.

(10) Patent No.: US 10,954,607 B1
(45) Date of Patent: Mar. 23, 2021

(54) HIGH-EFFICIENCY TRANSMISSION-MODE DIAMOND SCINTILLATOR FOR QUANTITATIVE CHARACTERIZATION OF X-RAY BEAMS

(71) Applicant: Euclid Techlabs, LLC, Solon, OH (US)

(72) Inventors: Sergey Antipov, Naperville, IL (US); Stanislav Stoupin, Groton, NY (US); Alexandre M. Zaitsev, Staten Island, NY (US)

(73) Assignees: Euclid Techlabs, LLC, Solon, OH (US); Center for Technology Licensing ("CTL") at Cornell University, Ithaca, NY (US); Research Foundation of The City University of New York, New York, NY (US)

( * ) Notice: Subject to any disclaimer, the term of this patent is extended or adjusted under 35 U.S.C. 154(b) by 0 days.

(21) Appl. No.: 16/659,642

(22) Filed: Oct. 22, 2019

(51) Int. Cl.
*G01T 1/20* (2006.01)
*C30B 25/20* (2006.01)
(Continued)

(52) U.S. Cl.
CPC ............ *C30B 29/04* (2013.01); *C30B 25/02* (2013.01); *C30B 33/02* (2013.01); *C30B 33/04* (2013.01);
(Continued)

(58) Field of Classification Search
CPC ......... C30B 19/12; C30B 25/20; C30B 25/18; C30B 25/183; C30B 29/02; C30B 29/04; C30B 33/02; C30B 33/04; G01T 1/20
See application file for complete search history.

(56) References Cited

U.S. PATENT DOCUMENTS

| 5,097,133 A | 3/1992 | Nam et al. |
| 5,773,830 A | 6/1998 | Lu et al. |

(Continued)

FOREIGN PATENT DOCUMENTS

EP 0582397 A2 2/1994

OTHER PUBLICATIONS

Zhou, T. , Ding, W. , Gaowei, M. , De Geronimo, G. , Bohon, J. , Smedley, J. and Muller, E. (2015), Pixelated transmission-mode diamond X-ray detector. Jnl of Synchrotron Radiation, 22: 1396-1402. doi:10.1107/S1600577515014824.
(Continued)

*Primary Examiner* — David P Porta
*Assistant Examiner* — Fani Boosalis
(74) *Attorney, Agent, or Firm* — Maine Cernota & Rardin (57) ABSTRACT

The luminance of a transmission mode X-ray scintillator diamond plate is dominated by induced defect centers having an excited state lifetime less than 10 msec, and in embodiments less than 1 msec, 100 usec, 10 used, 1 used, 100 nsec, or even 50 nsec, thereby providing enhanced X-ray luminance response and an X-ray flux dynamic range that is linear with X-ray flux on a log-log scale over at least three orders of magnitude. The diamond plate can be a single crystal having a dislocation density of less than $10^4$ per square centimeter, and having surfaces that are ion milled instead of mechanically polished. The defect centers can be SiV centers induced by silicon doping during CVD diamond formation, and/or NV0 centers formed by nitrogen doping followed by applying electron beam irradiation of the diamond plate and annealing.

19 Claims, 3 Drawing Sheets

(51) Int. Cl.
       *C30B 33/04*      (2006.01)
       *C30B 29/04*      (2006.01)
       *C30B 25/02*      (2006.01)
       *G01T 1/29*       (2006.01)
       *C30B 33/10*      (2006.01)
       *C30B 33/02*      (2006.01)
       *H01L 31/0368*    (2006.01)

(52) U.S. Cl.
       CPC ............ *C30B 33/10* (2013.01); *G01T 1/2921* (2013.01); *H01L 31/03682* (2013.01)

(56) References Cited

U.S. PATENT DOCUMENTS

| | | | |
|---|---|---|---|
| 8,242,455 B2 * | 8/2012 | Whitehead | G01T 1/26 250/370.14 |
| 8,546,249 B2 * | 10/2013 | Tillack | H01L 21/02381 438/488 |
| 9,625,586 B2 * | 4/2017 | Kaneko | G01T 3/06 |
| 2010/0219350 A1 | 9/2010 | Kobashi et al. | |

OTHER PUBLICATIONS

Park, J. Y., Kim, Y., Lee, S. and Lim, J. (2018), X-ray beam-position feedback system with easy-to-use beam-position monitor. J. Synchrotron Rad., 25: 869-873. doi:10.1107/S1600577518002692.

\* cited by examiner

HIGH-EFFICIENCY TRANSMISSION-MODE DIAMOND SCINTILLATOR FOR QUANTITATIVE CHARACTERIZATION OF X-RAY BEAMS

STATEMENT OF GOVERNMENT INTEREST

Portions of the present invention may have been made in conjunction with Government funding under National Science Foundation grant number DMR-1332208 and Department of Energy SBIR grant DE-SC0019628, and there may be certain rights to the Government.

FIELD OF THE INVENTION

The invention relates to X-ray beam apparatus, and more particularly, to apparatus and methods for characterizing the alignment, flux, and cross-sectional profile of an X-ray beam.

BACKGROUND OF THE INVENTION

When operating X-ray beam apparatus, such as experimental stations of large-scale synchrotron and X-ray free electron laser (XFEL) facilities, it is important to be able to visualize and monitor the x-ray beam alignment and flux profile.

Conventional diamond X-ray beam position monitors such as a diamond fluorescent screen can be used for intermittent checking of the beam, whereby motorized stages drop the screen into place to check the beam quality and location and then remove the screen to allow the beam to pass on to the experiment. The quality of the diamond used in these screens determines not only the color of the fluorescence but also the resolution that can be achieved, because grain boundaries, non-diamond carbon, and other defects act as electron traps that produce secondary emission. Typically, such diamond fluorescent screens are an appropriate choice for larger X-ray beams, where visible detection of the fluorescence is possible. However, this approach offers limited information regarding the beam flux and profile, and does not enable "in-operando" monitoring of the beam, i.e. while an experiment is in progress or the beam is otherwise in use.

One approach that does offer in-operando monitoring is to place a diamond "blade" monitor within the beam path, where a diamond blade monitor is a diamond sheet that has been metalized with gold contacts arranged in a pattern. As the x-ray beam interacts with the diamond, a current is generated in each blade proportional to the area of interaction. By observing the current intensity among the blades, the location of the beam is determined. Diamond blade monitors are also typically applicable to larger beams where reasonable gaps between blades can be set that allow for insignificant obstruction of the beam's passage.

For smaller beam sizes, thin diamond plates with contacts applied can be used as in-operando X-ray beam monitors. The number of contacts can be varied from as few as four up to a pixelated version that supplies a digital image of the beam. A recently demonstrated, quantitative approach for transmission-mode flux density monitoring features detection of electrical charge in a lithographically patterned (pixelated) diamond plate, is described for example in T. Zhou, et al., J. Synchrotron Rad. 22,1396, (2015). This approach includes applying structured (pixelated) electrodes to diamond produced by chemical vapor deposition (CVD) to enable imaging of the X-ray beam.

Blade monitors and other diamond plates that include applied contacts have the advantage that their performance is more predictable and consistent, because the beam detection does not depend upon interactions between the X-ray beam and defects in the diamond. However, such detectors can interfere with the X-ray beam (e.g., by X-ray scattering on the pixels). Also, dedicated readout electronics are required for use with a diamond blade monitor or a pixelated detector.

X-ray transmission-mode diamond plate scintillators can be used as a noninvasive (or minimally invasive) approach to monitor the position of an X-ray beam in-operando. An X-ray transmission mode diamond scintillator is a thin plate of diamond, typically between 50 microns thick and 300 microns thick, that produces an X-ray excited optical luminescence when impacted by an X-ray beam, while absorbing only a small amount of energy from the X-ray beam. Diamond is a preferable choice for an X-ray transmission-mode scintillator due to its low X-ray absorption, high radiation hardness, and remarkable thermal and mechanical properties. Commercially available diamond plate scintillators are produced using chemical vapor deposition (CVD). They are generally polycrystalline, and luminesce primarily in "band-A" due to interactions between the X-rays and dislocation defects in the diamond. In some cases nitrogen inclusions ("N" centers) in the diamond also contribute to the luminescence of the diamond plates.

One straightforward strategy for monitoring an X-ray beam using a diamond plate scintillator is simply to observe the scintillator using a visible-light imaging apparatus. Video-monitoring of X-ray excited optical luminescence in thin diamond plate X-ray transmission mode scintillators is commonly used for the purpose of beam profile and beam position monitoring. However, the luminance of commercially available diamond scintillator plates is typically linear as a function of X-ray flux only over a dynamic range of about one order of magnitude. In addition, the X-ray luminance characteristics of commercial diamond scintillator plates can vary significantly between supposedly identical diamond plates. This is at least partly because the naturally occurring dislocation defects and N centers that give rise to the luminescence of the diamond plates can vary significantly from one diamond plate to the next i,e, between plates that are prepared using nominally identical methods.

As a result, transmission mode diamond plate scintillators generally provides only semi-quantitative information, whereby the observed profile is evaluated based on visual appearance characteristics (e.g., spatial resolution, relative brightness), typically without documented knowledge of the response linearity and dynamic detection range of the diamond plate or video monitor. For example, Park et al. (J. Y. Park, et al., J. Synchrotron Rad. 25, 869-873 (2018)) achieved 3 micron beam position stability for a monochromatic beam using a commercial diamond screen as a real-time imaging detector. However, Park did not disclose any information regarding linearity or dynamic range.

What is needed, therefore, is an apparatus and method for real-time in-operando profiling of flux density distribution in a chosen observation plane placed across the direction of propagation of an X-ray beam that can be used to derive quantitative metrics such as average beam position and intensity/photon flux over a chosen region of interest, as well as position and intensity fluctuations of the X-ray beam.

SUMMARY OF THE INVENTION

The present invention comprises a diamond plate that can be implemented as a transmission mode diamond plate scintillator, and a method of making the disclosed diamond plate, wherein the novel diamond plate provides enhanced intensity, linearity, and dynamic range of X-ray optical luminescence. The present invention further provides an apparatus and method for real-time in-operando profiling of flux density distribution in a chosen observation plane placed across the direction of propagation of an X-ray beam that can be used to derive quantitative metrics such as average beam position and intensity/photon flux over a chosen region of interest, as well as position and intensity fluctuations of the X-ray beam.

The present inventors have realized that the X-ray luminance of commercial diamond plate scintillators arises primarily from interaction between incident X-rays and dislocation defects, and sometimes also "N" (nitrogen inclusion) sites, that are present in the diamond. The present inventors have further realized that the excited electronic states of these dislocation defects and N sites have long lifetimes, typically longer than 100 ms and sometimes as long as 10 seconds, such that the excited states become easily saturated by X-rays, thereby reducing the dynamic range of the scintillator and leading to a highly nonlinear dependence of the luminance on the X-ray flux. It will be understood that the terms "electronic excited state" and "excited state" are used herein to refer generically to any transient state that originates by absorption of X-ray energy and terminates in re-emission of at least some of that energy as optical luminance. It will be further understood that the terms "defect" and "center" are used herein to refer generally to any structural feature in diamond that can give rise to X-ray luminance, including but not limited to dislocations, grain boundaries, atomic inclusions, and crystal lattice voids.

The present invention comprises a diamond scintillator plate for which the X-ray luminescence is dominated by X-ray luminance defect centers having excited states with lifetimes shorter than 10 msec, and in embodiments shorter than 1 msec, in some embodiments shorter than 100 us, in various embodiments shorter than 10 us, in certain embodiments shorter than 1 us, in some of these embodiments short than 100 nsec, and in some of these embodiments shorter than 50 nsec, where the term "dominated" is used herein to mean that at least 90 percent of the luminance arises from the dominant defect centers. In embodiments, the dominant defect centers include at least one of neutral nitrogen vacancy (NV0) centers and silicon vacancy (SiV) centers. The lifetimes of NV0 center X-ray luminance excited states is about 20 nsec, and the lifetimes of SiV center X-ray luminance excited states is about 2 nsec. In embodiments, the resulting X-ray luminance dynamic range of the disclosed diamond plate and scintillator apparatus as a function of X-ray flux is at least three orders of magnitude. This increased dynamic range provides higher luminance as a function of X-ray flux, and also enables quantitative characterization of the X-ray flux.

In embodiments of the disclosed method of manufacture, the defect centers are induced in the novel diamond plate. For example, SiV centers can be induced by including silicon as a dopant in the reaction gas during chemical vapor deposition, while NV0 centers can be induced by including nitrogen as a dopant in the reaction gas during chemical vapor deposition, followed by irradiating the diamond plate with an electron beam and then annealing of the diamond plate. As a result, the concentration of X-ray luminance centers in the novel diamond plate, and hence the luminance as a function of X-ray flux, can be arbitrarily high, so long as the transmitted X-ray beam is not unduly attenuated by the luminance centers. Embodiments of the present invention are thereby able to detect and characterize X-ray beams at very low flux levels, including pulsed or "bunched" X-ray beams.

The disclosed diamond scintillator plate thereby provides a high luminance and enhanced response linearity to X-ray flux due to a combination of at least two factors, which are an enhanced concentration of the luminance defect centers and dominance of the X-ray luminescence by defect centers that have short electron excitation lifetimes, so that the defect centers remain unsaturated up to relatively high X-ray flux levels. The resulting responsivity and the dynamic range and linearity of the luminescence as a function of X-ray flux is increased by more than one order of magnitude as compared to commercially available diamond screens of the same thickness.

Furthermore, in embodiments, because the defects that dominate the luminescence in the scintillator of the present invention are intentionally created, rather than naturally or accidentally occurring, the sensitivity, linearity, and dynamic range of the disclosed diamond scintillator can be made consistent among a plurality of similarly prepared diamond plates, such that a luminance calibration performed on one diamond plate from a group of similarly prepared diamond plates can often be used to obtain quantitative flux profile measurements using any of the diamond plates in the group.

The present invention is applicable to both polycrystalline diamond plates and to single crystal diamond plates. However, single crystal diamond plates may be preferred in some applications so as to avoid any diffractive effects and/or other small variations in X-ray transparency that might arise due to crystal boundaries within the diamond plate, and thereby to provide even greater consistency in performance between nominally identical plates. In embodiments, the diamond plate is a single crystal diamond plate having a dislocation density of less than $10^4$ per square centimeter.

In embodiments, the enhanced luminance diamond plate of the present invention can be used to quantitatively monitor the photon flux of an X-ray beam down to a minimum flux of $1 \times 10^9$ photons per square millimeter per second or less, and the response to the incident X-ray photon flux can be linear over the range of $7.6 \times 10^8$ to $1.26 \times 10^{12}$ photons per square millimeter per second at an X-ray photon energy of 15.9 keV. Embodiments enable monitoring and characterization of transmission-mode "single-bunch" X-ray pulses by separately imaging synchrotron X-ray radiation pulses with bunch spacings of between 100 ps and 100 ns separation between bunches. Embodiments further provide a well-characterized dependence of the diamond plate luminance on the photon energy of the X-ray beam.

Embodiments of the disclosed diamond X-ray scintillation plate of the present invention thereby enable construction of real-time, minimally-invasive, transmission-mode flux density monitors that can provide in-operando measurement and calibration of X-ray beam profiles in absolute units of incident flux density over a wide range of flux intensities.

A first general aspect of the present invention is a diamond plate suitable for in-operando quantitative characterization of an X-ray beam flux profile by luminance induced in X-ray transmission mode. The diamond plate includes a diamond plate having a thickness and having first and second faces, and a plurality of defect centers included within the diamond plate, said defect centers, when impacted by X-rays, being caused by the X-rays to transition from a ground state to an excited state, remain in the excited state until an excited state lifetime has elapsed, and then return to said ground state while emitting electromagnetic radiation as luminance, said excited state lifetime being less than 10 msec, and in embodiments less than 1 msec, in some embodiments less than 100 us, in various embodiments less than 10 us, in certain embodiments less than 1 us, in some of these embodiments short than 100 nsec, and in some of these embodiments less than 50 nsec for all of said defect centers, where the luminance of said defect centers is responsible for at least 90% of a total X-ray luminance of the diamond plate.

In embodiments, the diamond plate is a single crystal of diamond. In some of these embodiments the single crystal diamond plate has a dislocation density of less than $10^4$ per square centimeter.

In any of the above embodiments, each of the defect centers can be either a neutral nitrogen void (NV0) defect center or a silicon void (SiV) defect center.

In any of the above embodiments, the thickness of the diamond plate can be between 20 microns and 300 microns.

In any of the above embodiments, the total X-ray luminance of the diamond plate as a function of X-ray flux can have a dynamic range that is at least three orders of magnitude. In some of these embodiments the total X-ray luminance of the diamond plate when plotted on a log-log scale as a function of X-ray flux is linear over the three orders of magnitude.

A second general aspect of the present invention is a method of manufacturing a diamond plate suitable for in-operando quantitative characterization of an X-ray beam flux profile by transmission mode luminance. The method includes forming a diamond plate by chemical vapor deposition (CVD), the diamond plate having a thickness and having first and second faces, and forming a plurality of defect centers in the diamond plate, said defect centers, when impacted by X-rays, being caused to transition from a ground state to an excited state, remain in the excited state until an excited state lifetime has elapsed, and then return to said ground state while emitting electromagnetic radiation as luminance, said excited state lifetime for all of said defect centers being less than 10 msec, and in embodiments less than 1 msec, in some embodiments less than 100 us, in various embodiments less than 10 us, in certain embodiments less than 1 us, in some of these embodiments short than 100 nsec, and in some of these embodiments less than 50 nsec, wherein the luminance of said defect centers is responsible for at least 90% of a total X-ray luminance of the diamond plate.

In embodiments of this general aspect, forming the diamond plate includes forming the diamond plate as a single crystal diamond plate. In some of these embodiments the single crystal diamond plate has a dislocation density of less than $10^4$ per square centimeter.

In any of the above embodiments of this general aspect, forming the plurality of defect centers can comprise forming silicon void (SiV) defect centers in the diamond plate by including silicon as a dopant in a reaction gas while forming the diamond plate by CVD.

In any of the above embodiments of this general aspect, forming the plurality of defect centers can comprise forming neutral nitrogen void (NV0) defect centers in the diamond plate by including nitrogen as a dopant in a reaction gas while forming the diamond plate by CVD, applying electron beam irradiation to the diamond plate after it has been formed, and annealing the diamond plate after application of the electron beam irradiation.

In any of the above embodiments of this general aspect, the method can be such that it does not include applying mechanical polishing to either of the first and second faces of the diamond plate Any of the above embodiments of this general aspect can further include applying at least one of ion milling and chemical etching to at least one of the first and second faces of the diamond plate.

A third general aspect of the present invention is an apparatus for in-operando quantitative characterization of a flux profile of an X-ray beam. The apparatus includes a diamond plate according to any embodiment of the first general aspect, said diamond plate being configured as a transmission mode diamond plate X-ray scintillator.

Embodiments of this general aspect further include a visible light imaging device configured to image visible light luminance emitted by the diamond plate when the diamond plate is impacted by an X-ray beam. Some of these embodiments further include an enclosure configured to ensure that only the visible light luminance emitted by the diamond plate is imaged by the visible light imaging device.

In any of the above embodiments of this general aspect, a dynamic range of X-ray flux intensity over which the apparatus is able to quantitatively characterize the flux profile of the X-ray beam can be at least three orders of magnitude.

In any of the above embodiments of this general aspect, the apparatus can be able to detect an X-ray flux of $8 \times 10^8$ photons per second.

A fourth general aspect of the present invention is an in-operando method of quantitatively characterizing a flux profile of an X-ray beam. The method includes providing an apparatus according to any embodiment of the third general aspect of the invention, determining a calibration of luminance of the diamond plate as a function of impinging X-ray beam flux and photon energy, positioning the diamond plate so that it is impinged by the X-ray beam, measuring the luminance of the diamond plate over the profile of the X-ray beam, and using the calibration to determine the flux profile of the X-ray beam.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present invention comprises a diamond plate suitable for use as an X-ray transmission-mode scintillator, and a method of manufacture thereof, having X-ray optical luminescence with enhanced intensity, linearity, and dynamic range as a function of X-ray flux intensity. The invention further comprises a method and apparatus for real-time, in-operando profiling of flux density distribution in a chosen observation plane placed across the direction of propagation of an x-ray beams that can be used to derive quantitative metrics such as average beam position and intensity/photon flux over a chosen region of interest, as well as position and intensity fluctuations of the X-ray beam.

More specifically, the present invention comprises a diamond scintillator plate for which the X-ray luminescence is dominated by X-ray luminance defect centers having excited states with lifetimes shorter than 10 msec, and in embodiments shorter than 1 msec, in some embodiments shorter than 100 us, in various embodiments shorter than 10 us, in certain embodiments shorter than 1 us, in some of these embodiments short than 100 nsec, and in some of these embodiments shorter than 50 nsec, where the term "dominated" is used herein to mean that at least 90 percent of the luminance arises from the dominant defect centers. In embodiments, the dominant defect centers include at least one of neutral nitrogen vacancy (NV0) centers and silicon vacancy (SiV) centers.

The disclosed scintillator plate provides a high luminance and enhanced response linearity due to a combination of at least two factors, which are an enhanced concentration of the luminance defect centers and dominance of the X-ray luminescence by defect centers that have short electronic excitation lifetimes, so that the defect centers remain unsaturated up to relatively high X-ray flux levels. The resulting responsivity and the dynamic range and linearity of the luminescence as a function of X-ray flux is increased by more than one order of magnitude as compared to commercially available diamond screens of the same thickness.

In the preparation of an exemplary embodiment, a single crystal diamond plate was created using chemical vapor deposition (CVD), wherein nitrogen was included as a dopant in the reaction gas. NV0 vacancies were then created in the diamond lattice of the single crystal diamond plate by irradiating the plate with a 1 MeV electron beam with a total dose of $5e^{18}/cm^2$. Annealing was then performed at 1100° C. for 10 minutes under vacuum or in an inert gas atmosphere. The result was a diamond plate for which the X-ray luminance was dominated by the induced NV0 centers.

The surfaces of the diamond plate were ion milled rather than mechanically polished. In similar embodiments, the surfaces of the diamond plate can be chemically etched as an alternative to mechanical polishing. The uniformity of luminescence over a diamond plate surface can be affected by scratches and microcracks arising from mechanical polishing. Such mechanical damage is known to strongly produce and/or activate NV defects in nitrogen-containing diamonds. It was therefore anticipated that mechanical polishing could introduce unpredictable fluctuations in NV defect concentrations between plates and non-uniform distribution of NV defects across each plate. Embodiments therefore avoid mechanical polishing in favor of ion milling and/or chemical etching.

Figure 1A:
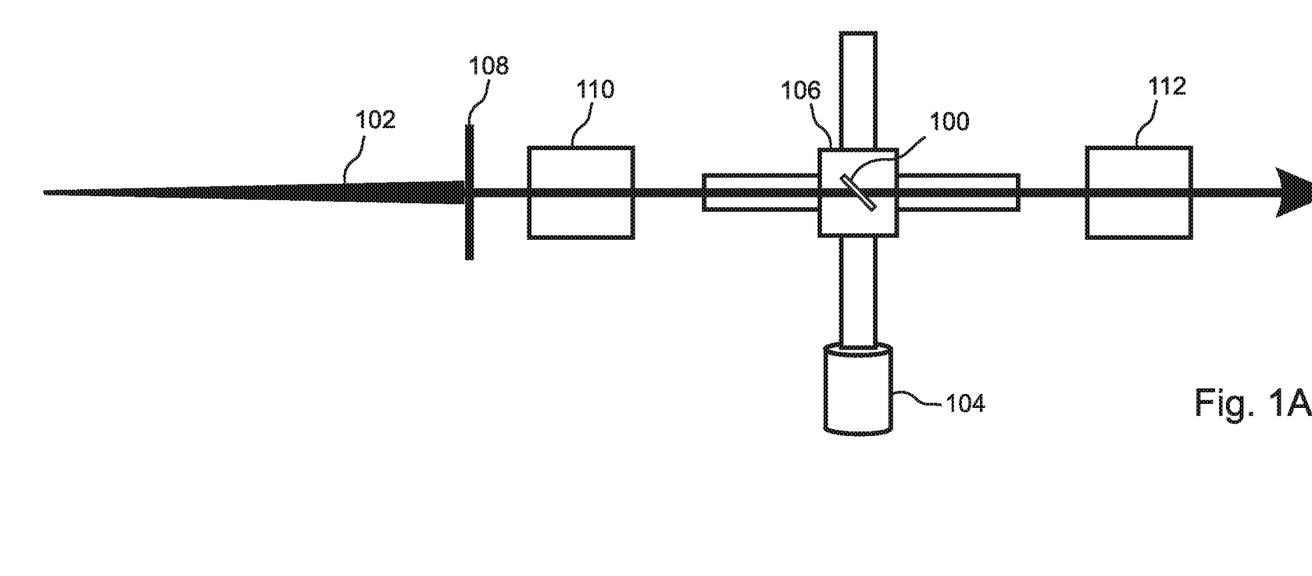
FIG. 1A is a block diagram of an apparatus for characterizing a flux profile of an X-ray beam according to an embodiment of the present invention.

With reference to FIG. 1A, the diamond scintillator plate 100 of the exemplary embodiment was placed at an angle of 45 degrees with respect to an incident x-ray beam 102, and a digital camera 104 that served as an area detector for visible light was placed at 90 degrees with respect to the incident x-ray beam 102, so that it could observe the beam footprint on the plate 100, which generated luminescence in the visible range. The camera 104 was equipped with an objective, which refocused the luminescent beam footprint onto the camera's sensor. The diamond scintillator 100 was placed in a light-tight enclosure 106 to exclude ambient light and other extraneous light. The X-ray beam 102 was directed through x-ray slits 108 before entering the enclosure 106, and also through a first ionization chamber 110. The first ionization chamber 110 was used to measure the total flux of the X-ray beam, as a basis upon which the response of the scintillator 100 to the X-ray flux density of the beam 102 could be calibrated in absolute units.

A second ionization chamber 112 was placed downstream of the scintillator 100 and was used to quantify the degree of absorption of the x-rays 102 by the scintillator 100 and other elements of the system. In embodiments, light losses can be further minimized by using more efficient objective optics and/or by including image intensifiers, as well as by using low-noise cameras with optimally adjusted gains.

Figure 1B:
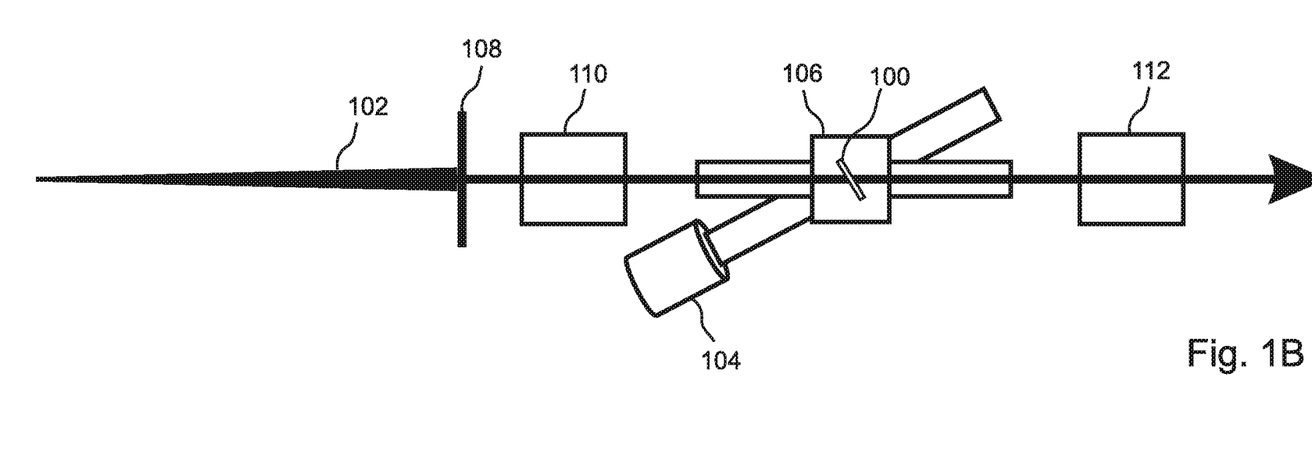
FIG. 1B is a block diagram of an embodiment similar to FIG. 1A.

With reference to FIG. 1B, in similar embodiments of the method of characterizing the flux profile of an X-ray beam, as included in the present invention, the camera 104 can be placed at an arbitrary viewing angle with respect to the X-ray beam 102, so long as the camera 104 does not block the incident or the reflected portions of the X-ray beam 102. For example, as illustrated in FIG. 1B, the camera 104 can be placed at a shallow angle (nearly on-axis) to the X-ray beam 102 to achieve improved spatial resolution.

When characterizing the exemplary embodiment and comparing it to commercially available diamond scintillators, it was found that the response of the camera 104 to the luminance of the scintillator 100, measured as a sum of pixel intensity across the footprint image of the X-ray beam 102, normalized by the number of pixels, was linear over exposure times from 0.01 second up to 5 seconds. As a result, measurements could be made over a dynamic range that far exceeded the dynamic range of the camera 104 simply by varying the exposure time.

Figure 2:
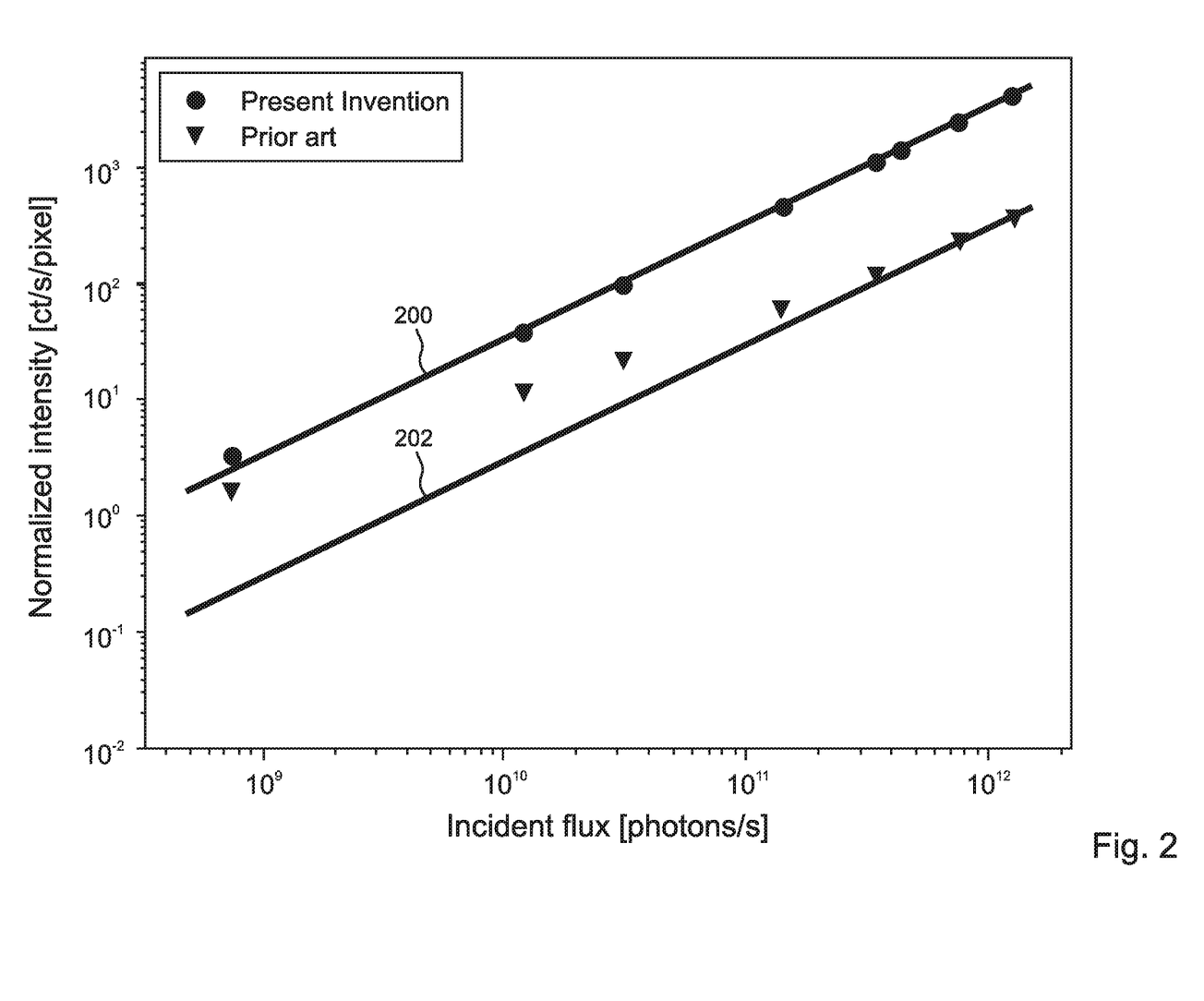
FIG. 2 is a log-log plot of normalized luminance intensity vs incident X-ray flux of a diamond plate scintillator according to an embodiment of the present invention in comparison with a commercially available diamond scintillator.

The time-normalized response 200 of the diamond scintillator plate of the exemplary embodiment is compared in FIG. 2 with a result 202 obtained under the same conditions using a commercially available polycrystalline diamond plate. The results are presented on a log-log scale as a function of the incident photon flux at 15.9 keV plotted on a log-log scale. The solid lines 200, 202 in the figure are linear fits to the data, with proportionality coefficients of $3.2 \times 10^{-9}$ for the exemplary embodiment 200 and $2.9 \times 10^{-10}$ for the commercially available diamond plate 202.

It can be seen in FIG. 2 that the luminance of the exemplary embodiment 200 is substantially linear over the entire range of measurement, while the response of the commercial diamond plate 202 deviates significantly from linear behavior. This non-linear behavior of the commercial diamond plate 202 significantly reduces the dynamic range over which the commercial plate 202 can be used for quantitative flux determination, as compared to the exemplary embodiment. The luminance response of the exemplary embodiment 200 is also greater in magnitude than the response of the commercial diamond plate 202 by more than one order of magnitude. The detected levels of the photon flux for the exemplary embodiment are from $7.6 \times 10^8$ to $1.26 \times 10^{12}$ photons/s.

Figure 3:
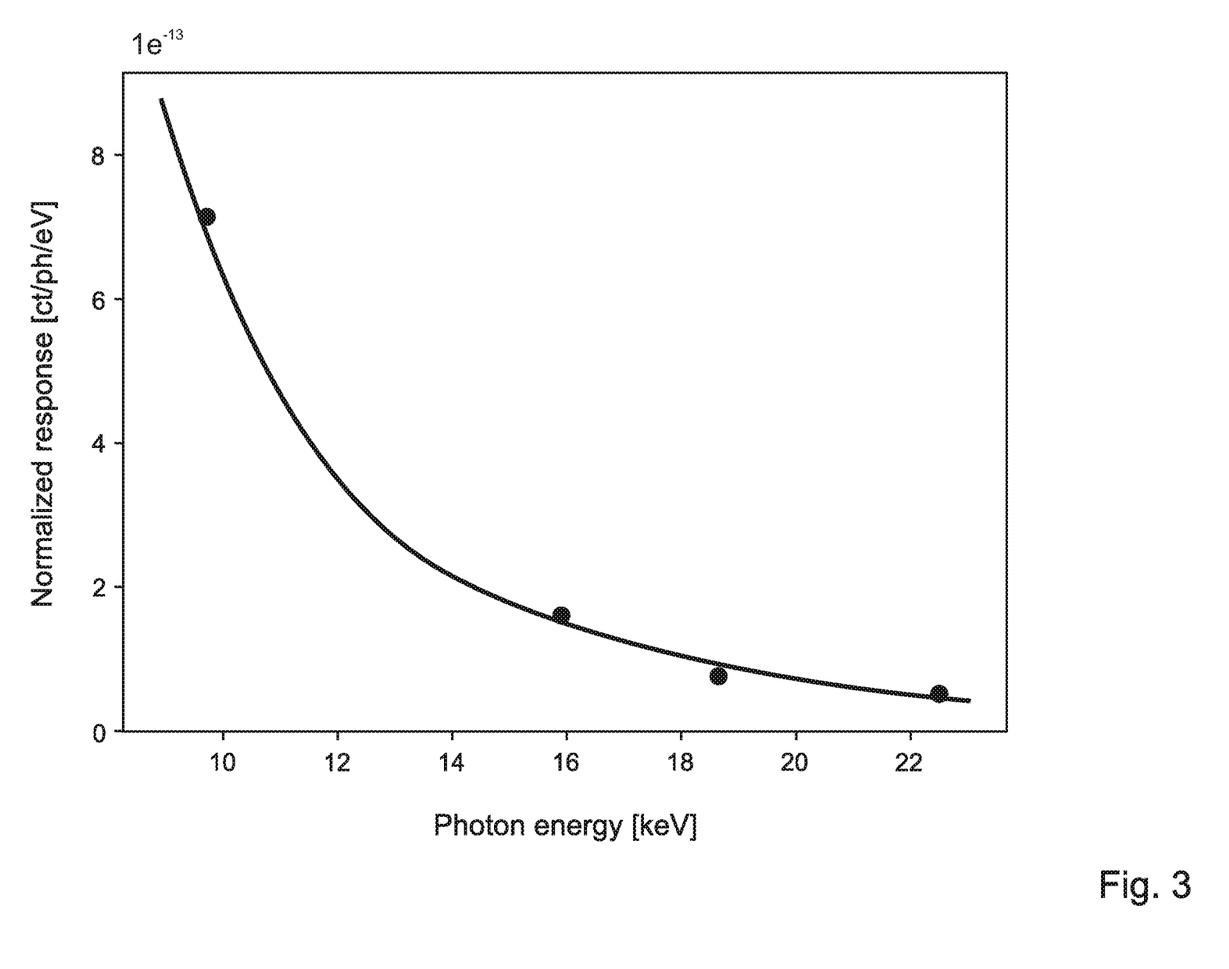
FIG. 3 is a plot of normalized luminance response vs. X-ray photon energy for the diamond plate embodiment of FIG. 2.

The response of the exemplary diamond scintillator disk was measured at several fixed X-ray photon energies. Under conditions of negligible re-scattering and self-absorption of luminescence, which are applicable to thin diamond plates of optical grade, the response as a function of the x-ray photon energy $E_X$ can be approximated [6] by:

$$R(E_X) \approx FE_X(1-\exp[-\mu(E_X)t]) \qquad (1)$$

where F is the incident photon flux, $\mu(E_X)$ is the x-ray attenuation coefficient of the material (for practical purposes the mass-energy attenuation coefficient is often used), and t is the thickness of the plate. Here it is assumed that the energy conversion efficiency and the quantum yield do not depend on the x-ray photon energy, which is a valid assumption for hard X-rays since the photon energies are substantially above the characteristic energies of any electronic transitions of a carbon atom.

The luminescence response of the exemplary embodiment diamond scintillator plate averaged over a 1 mm×1 mm square beam footprint and normalized by the incident x-ray flux and the x-ray photon energy is presented in FIG. 3 as a function of the photon energy. According to Eq. 1, this ratio is expected to be proportional to the absorptivity of the diamond plate. The absorptivity of the exemplary embodiment plate for the nominal 100 μm plate thickness, scaled to the experimental data using the optimal proportionality coefficient, is plotted with a solid line in the figure. The agreement between the experiment and Eq.1 is good. The observed minor discrepancies can be assigned to uncertainties in determination of the x-ray photon flux.

In various embodiments, the diamond scintillator plate of the present invention can be produced using any known method, including high temperature high pressure (HPHT) and chemical vapor deposition (CVD), and can take on any convenient shape, such as round, square, triangular, hexagonal, etc. The exemplary embodiment included NV0 centers that were induced by electron beam irradiation followed by annealing. Other embodiments include silicon vacancy (SiV) centers that are induced for example during CVD diamond formation by including silicon as a dopant in the input gas of a CVD reactor.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications without departing from the spirit thereof. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:

1. A diamond plate suitable for in-operando quantitative characterization of an X-ray beam flux profile by luminance induced in X-ray transmission mode, the diamond plate comprising:
    a diamond plate having a thickness and having first and second faces; and
    a plurality of defect centers included within the diamond plate, said defect centers, when impacted by X-rays, being caused by the X-rays to transition from a ground state to an excited state, remain in the excited state until an excited state lifetime has elapsed, and then return to said ground state while emitting electromagnetic radiation as luminance, said excited state lifetime being less than 10 msec for all of said defect centers;
    said luminance of said defect centers being responsible for at least 90% of a total X-ray luminance of the diamond plate.

2. The diamond plate of claim 1, wherein the diamond plate is a single crystal of diamond.

3. The diamond plate of claim 1, wherein said excited state lifetime is less than 100 usec for all of said defect centers.

4. The diamond plate of claim 1, wherein said excited state lifetime is less than 1 usec for all of said defect centers.

5. The diamond plate of claim 1, wherein said excited state lifetime is less than 100 nsec for all of said defect centers.

6. The diamond plate of claim 1, wherein said excited state lifetime is less than 50 nsec for all of said defect centers.

7. The diamond plate of claim 1, wherein each of the defect centers is either a neutral nitrogen void (NV0) defect center or a silicon void (SiV) defect center.

8. The diamond plate of claim 1, wherein the total X-ray luminance of the diamond plate as a function of X-ray flux has a dynamic range that is at least three orders of magnitude.

9. The diamond plate of claim 8, wherein the total X-ray luminance of the diamond plate when plotted on a log-log scale as a function of X-ray flux is linear over the three orders of magnitude.

10. An apparatus for in-operando quantitative characterization of a flux profile of an X-ray beam, the apparatus comprising:
    a diamond plate according to claim 1, said diamond plate being configured to receive the X-ray beam as an incident X-ray beam and to produce a reflected portion and a transmitted portion of the X-ray beam, said diamond plate being configured to function as a transmission mode diamond plate X-ray scintillator;
    a light tight container surrounding the diamond plate; and
    a light detector configured to detect luminescent light emitted by the diamond plate, said light detector being located at a viewing angle with respect to the X-ray beam that does not cause the visible light detector to block the incident or the reflected portions of the X-ray beam.

11. The apparatus of claim 10, wherein the apparatus is able to detect an X-ray flux of $8 \times 10^8$ photons per second.

12. The apparatus of claim 10, wherein the diamond plate is approximately 100 micro-meters thick.

13. The apparatus of claim 10, further comprising X-ray slits configured to cause the X-ray beam to pass through the X-ray slits before striking the diamond plate.

14. The apparatus of claim 10, further comprising a first ionization chamber configured to cause the X-ray beam to pass through the first ionization chamber before striking the diamond plate.

15. The apparatus of claim 10, further comprising a second ionization chamber configured to cause the X-ray beam to pass through the second ionization chamber after passing through the diamond plate.

16. The apparatus of claim 10, wherein the light detector is a digital camera.

17. A method for real-time in-operando characterization of a property of an X-ray beam, the method comprising:
    providing an apparatus according to claim 10;

causing the incident X-ray beam to impact the diamond plate, thereby causing the diamond plate to emit luminescent light;

orienting the diamond plate so that it is parallel to a chosen observation plane relative to a direction of propagation of the incident X-ray beam;

locating the light detector at a viewing angle with respect to the incident X-ray beam that does not cause the light detector to block the incident X-ray beam nor the transmitted or reflected portions of the X-ray beam;

using the light detector to detect the luminescent light emitted by the diamond plate; and based on information provided by the light detector, characterizing the property of the X-ray beam.

18. The method of claim 17, wherein the light detector is a digital camera, and wherein characterizing the property of the X-ray beam includes profiling a flux density distribution of the incident X-ray beam in the chosen observation plane.

19. The method of claim 18, wherein a response of the digital camera to the luminescent light, measured as a sum of pixel intensity across a footprint image of the incident X-ray beam and normalized by a number of the pixels across the footprint image, is linear as a function of an exposure time of the digital camera, and wherein the method further comprises adjusting the exposure time of the digital camera so as to ensure that the footprint image is within a dynamic range of the digital camera.

* * * * *

UNITED STATES PATENT AND TRADEMARK OFFICE
CERTIFICATE OF CORRECTION

PATENT NO. : 10,954,607 B1
APPLICATION NO. : 16/659642
DATED : March 23, 2021
INVENTOR(S) : Sergey Antipov, Stanislav Stoupin and Alexandre M. Zaitsev It is certified that error appears in the above-identified patent and that said Letters Patent is hereby corrected as shown below:

In the Specification

Replace Column 1, Lines 8-12 with the following text:
This invention was made with government support under DE-SC0019628, and DE-SC0018554 awarded by the U.S. Department of Energy, and DMR-1332208 awarded by the National Science Foundation. The government has certain rights in the invention.

Signed and Sealed this
Twenty-sixth Day of September, 2023

Katherine Kelly Vidal
*Director of the United States Patent and Trademark Office*